United States Patent
Loubet et al.

(10) Patent No.: US 8,836,041 B2
(45) Date of Patent: Sep. 16, 2014

(54) DUAL EPI CMOS INTEGRATION FOR PLANAR SUBSTRATES

(71) Applicants: STMicroelectronics, Inc., Coppell, TX (US); International Business Machines Corporation, Armonk, NY (US)

(72) Inventors: Nicholas Loubet, Guilderland, NY (US); Balasubramanian Pranatharthiharan, Watervliet, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/679,434

(22) Filed: Nov. 16, 2012

(65) Prior Publication Data
US 2014/0138775 A1    May 22, 2014

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 27/01 | (2006.01) |
| H01L 27/12 | (2006.01) |
| H01L 31/0392 | (2006.01) |
| H01L 23/62 | (2006.01) |
| H01L 27/092 | (2006.01) |
| H01L 29/161 | (2006.01) |

(52) U.S. Cl.
CPC .......... H01L 27/0928 (2013.01); H01L 29/161 (2013.01)
USPC ........... 257/369; 257/338; 257/350; 257/351; 257/357; 257/371; 257/E27.062; 257/E27.067

(58) Field of Classification Search
CPC .............. H01L 21/8238; H01L 27/092; H01L 27/0922; H01L 27/0928; H01L 27/11807; H01L 29/7378
USPC ................. 257/338, 350, 351, 357, 369, 371, 257/E27.062, E27.067
See application file for complete search history.

(56) References Cited

U.S. PATENT DOCUMENTS

| | | | | |
|---|---|---|---|---|
| 5,847,419 | A * | 12/1998 | Imai et al. ..................... | 257/192 |
| 7,557,010 | B2 * | 7/2009 | Chen et al. .................... | 438/320 |
| 7,569,447 | B2 * | 8/2009 | Yang et al. .................... | 438/199 |
| 7,674,669 | B2 * | 3/2010 | Hanafi .......................... | 438/206 |
| 7,871,915 | B2 * | 1/2011 | Lim et al. ...................... | 438/592 |
| 8,101,479 | B2 * | 1/2012 | Parker et al. .................. | 438/231 |
| 8,134,204 | B2 * | 3/2012 | Benaissa et al. .............. | 257/337 |
| 2002/0008289 | A1 * | 1/2002 | Murota et al. ................ | 257/369 |
| 2006/0258073 | A1 * | 11/2006 | Greene et al. ................ | 438/199 |
| 2007/0134854 | A1 * | 6/2007 | Zhang et al. .................. | 438/142 |
| 2010/0224938 | A1 * | 9/2010 | Zhu ............................... | 257/369 |
| 2011/0070703 | A1 * | 3/2011 | Xiong et al. .................. | 438/231 |
| 2011/0278673 | A1 * | 11/2011 | Fuller et al. ................... | 257/347 |
| 2012/0052653 | A1 * | 3/2012 | Chidambarrao et al. ..... | 438/424 |
| 2012/0068261 | A1 * | 3/2012 | Kwon et al. .................. | 257/331 |
| 2012/0273894 | A1 * | 11/2012 | Chen et al. .................... | 257/369 |
| 2013/0175632 | A1 * | 7/2013 | Cai et al. ....................... | 257/369 |
| 2013/0200456 | A1 * | 8/2013 | Zhu et al. ...................... | 257/347 |
| 2013/0241004 | A1 * | 9/2013 | Yin et al. ...................... | 257/392 |

* cited by examiner

Primary Examiner — Ida M Soward

(57) ABSTRACT

Silicon germanium regions are formed adjacent gates electrodes over both n-type and p-type regions in an integrated circuit. A hard mask patterned by lithography then protects structures over the p-type region while the silicon germanium is selectively removed from over the n-type region, even under remnants of the hard mask on sidewall spacers on the gate electrode. Silicon germanium carbon is epitaxially grown adjacent the gate electrode in place of the removed silicon germanium, and source/drain extension implants are performed prior to removal of the remaining hard mask over the p-type region structures.

10 Claims, 11 Drawing Sheets

DUAL EPI CMOS INTEGRATION FOR PLANAR SUBSTRATES

TECHNICAL FIELD

The present disclosure relates generally to fabricating complementary metal oxide semiconductor integrated circuits and, more specifically, to epitaxial deposition of silicon germanium carbon layers in complementary metal oxide semiconductor integrated circuits.

BACKGROUND

Leading edge technologies require high performance at low-power operation. Epitaxial growth of silicon germanium carbon (often signified by any of "Si(Ge)(C)," "SiGe(C)" or "SiGe:C") layers can be an attractive solution to boost device performances. However n-channel metal oxide semiconductor (NMOS) and p-channel MOS (PMOS) transistors within complementary MOS (CMOS) designs require different epitaxies, creating challenges in protecting one type of transistor while performing epitaxy on the other transistor type. Conventional methods require patterning and the use of additional spacers on either NMOS or PMOS devices, which degrades device performance, makes integration very difficult, and leads to poor defect rates on the resulting circuits.

There is, therefore, a need in the art for an improved process for the epitaxial deposition of silicon germanium carbon layers during fabrication of CMOS integrated circuits.

SUMMARY

Silicon germanium regions are formed adjacent gates electrodes over both n-type and p-type regions in an integrated circuit. A hard mask patterned by lithography then protects structures over the p-type region while the silicon germanium is selectively removed from over the n-type region, even under remnants of the hard mask on sidewall spacers on the gate electrode. Silicon germanium carbon is epitaxially grown adjacent the gate electrode in place of the removed silicon germanium, and source/drain extension implants are performed prior to removal of the remaining hard mask over the p-type region structures.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
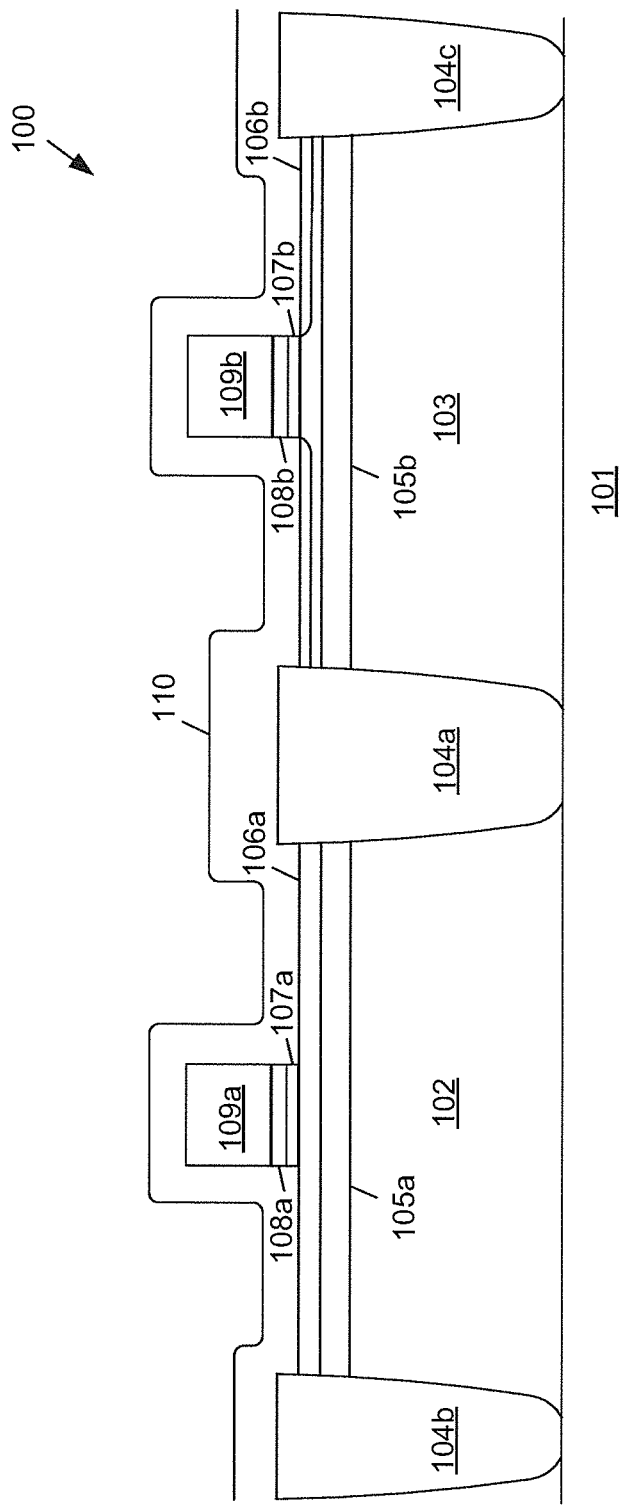
FIGS. 1A through 1J are sectional views of a portion of a semiconductor integrated circuit structure during a process of dual epitaxy CMOS integration for planar substrates in accordance with one embodiment of the present disclosure.
Figure 1B:
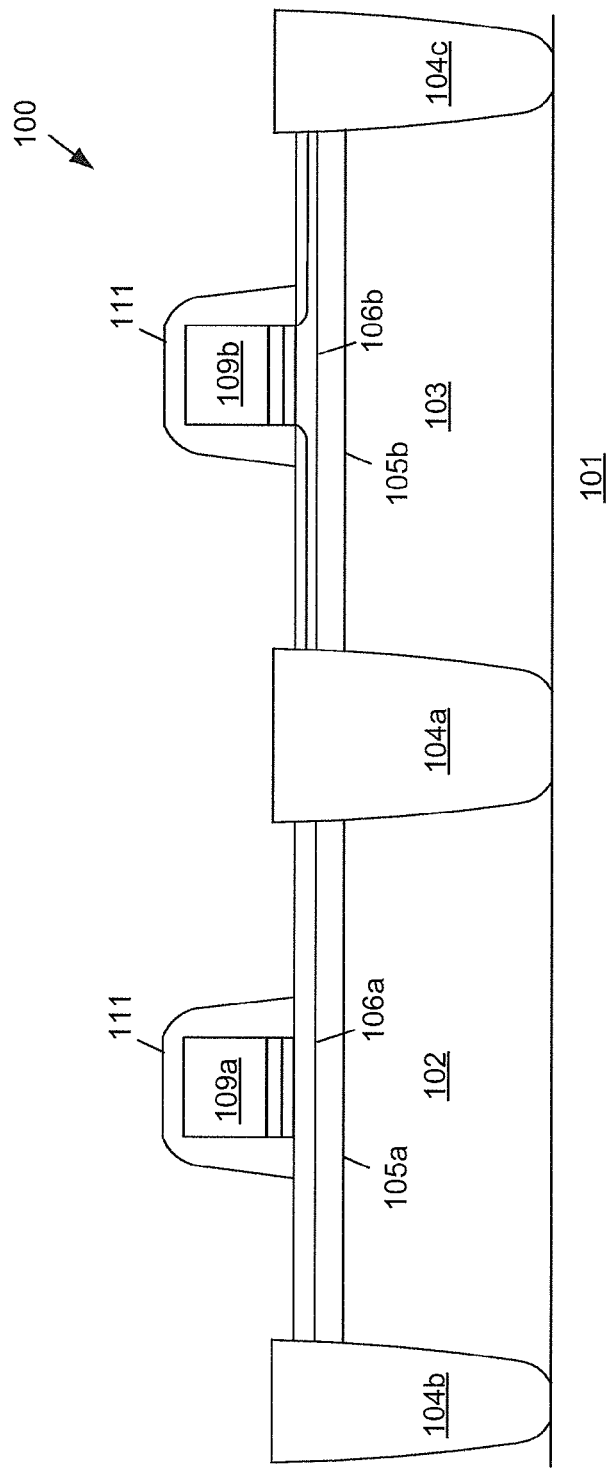
Figure 1C:
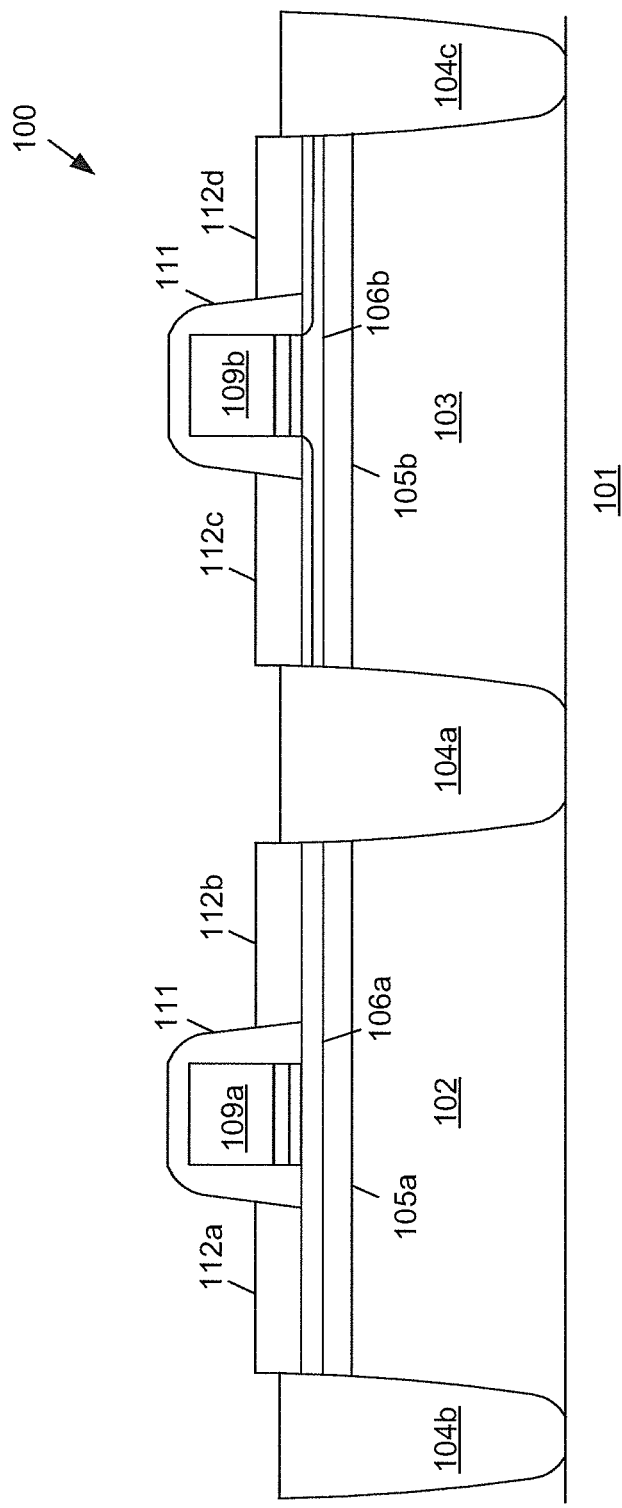
Figure 1D:
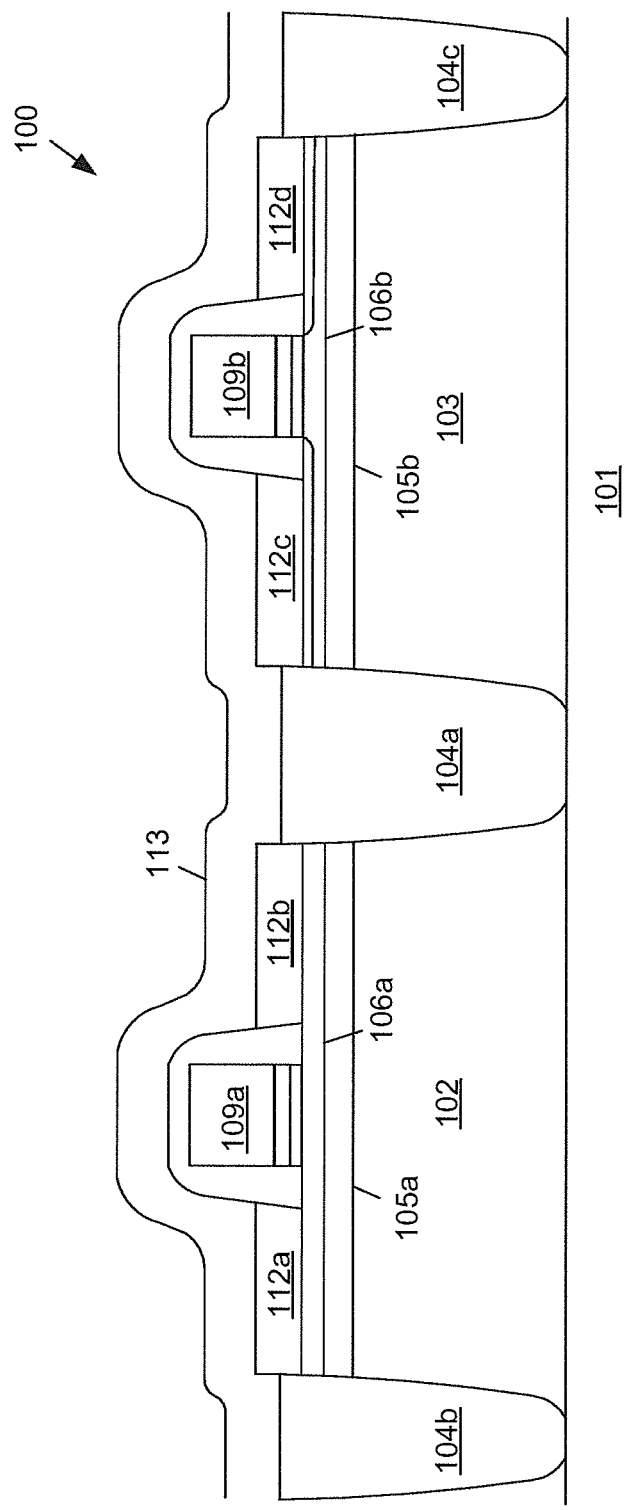
Figure 1E:
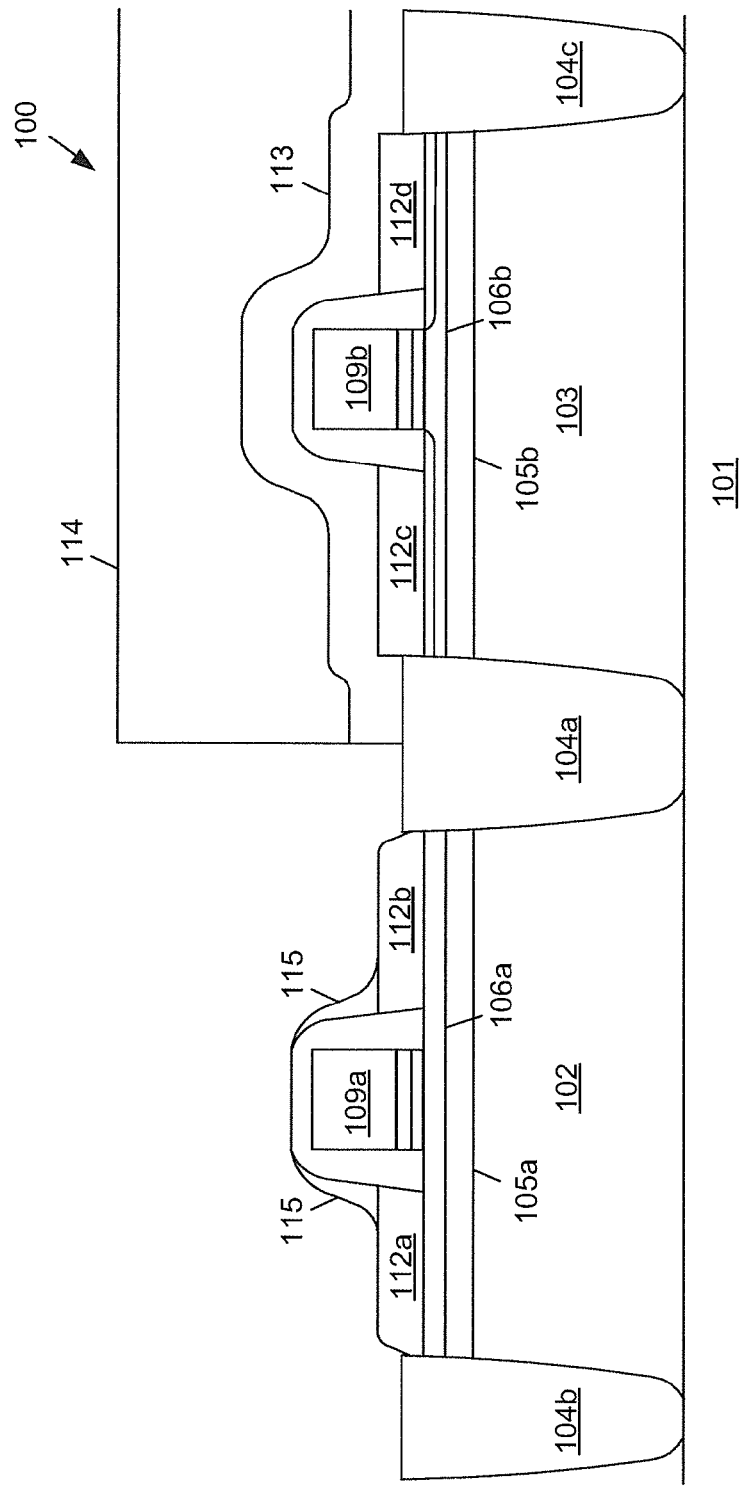
Figure 1F:
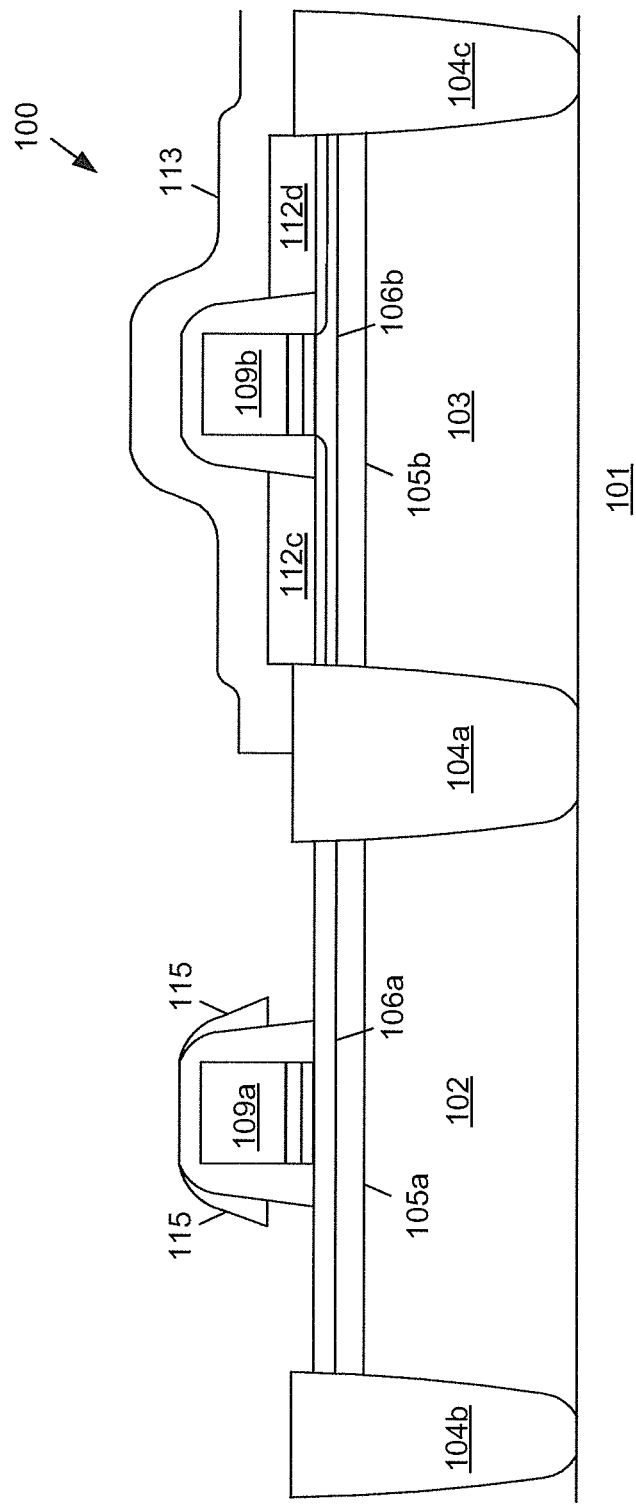
Figure 1G:
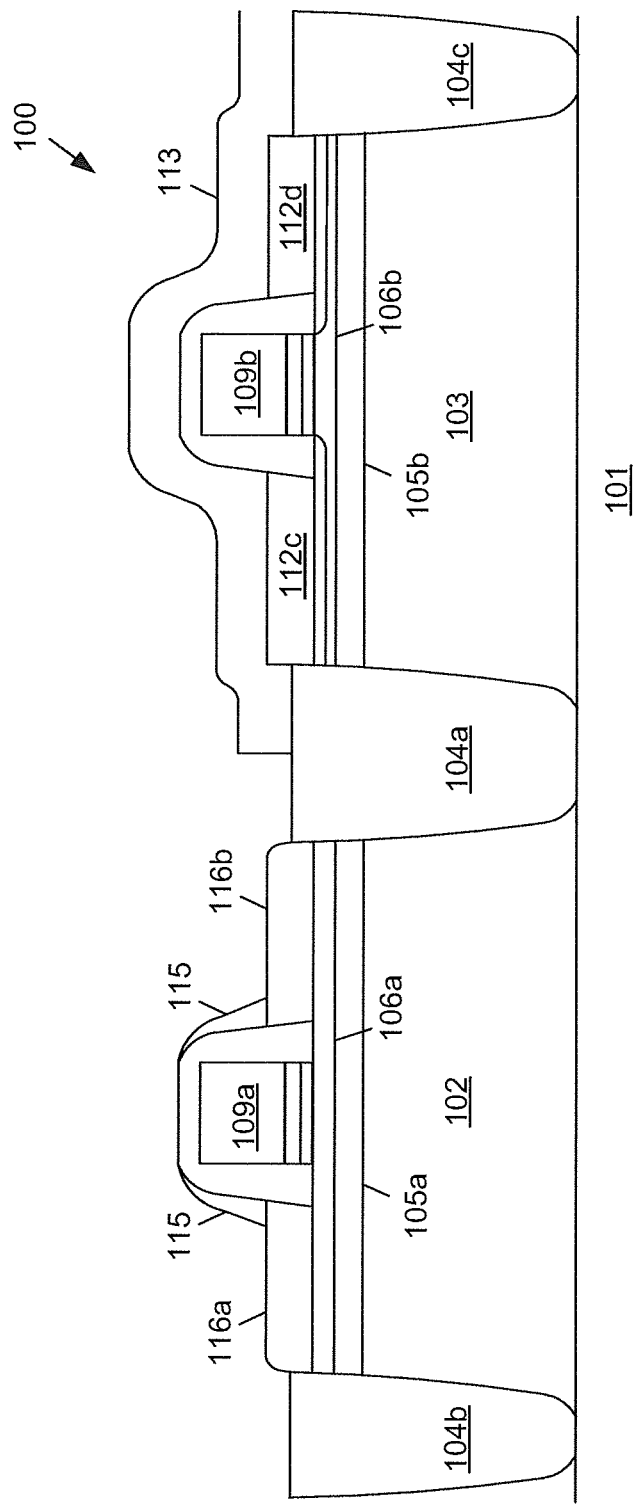
Figure 1H:
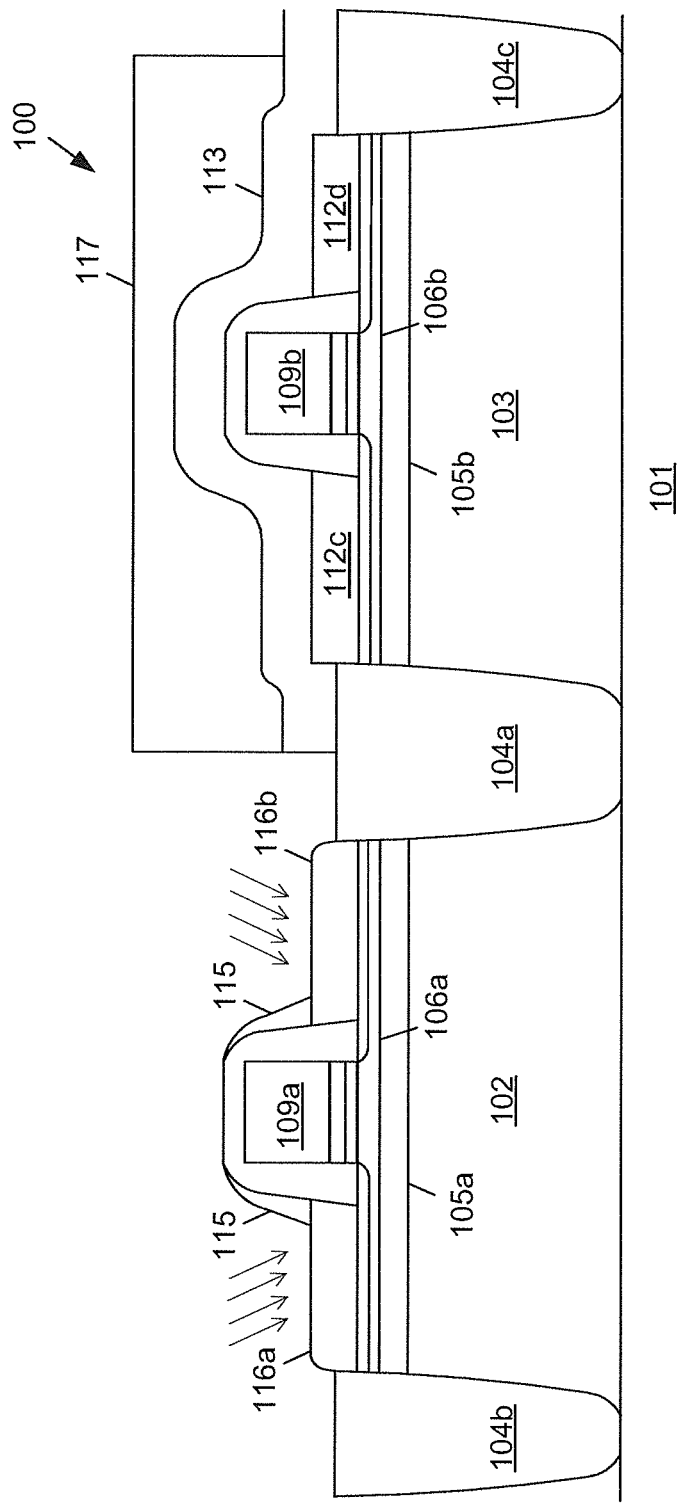
Figure 1I:
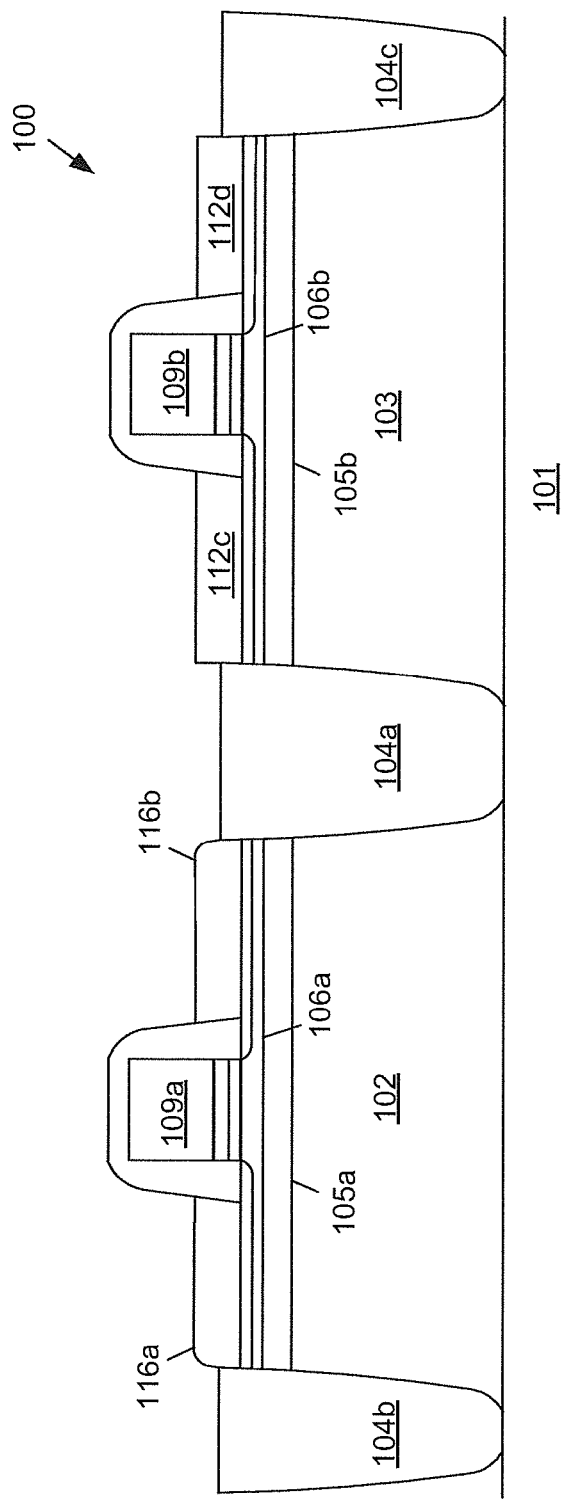
Figure 1J:
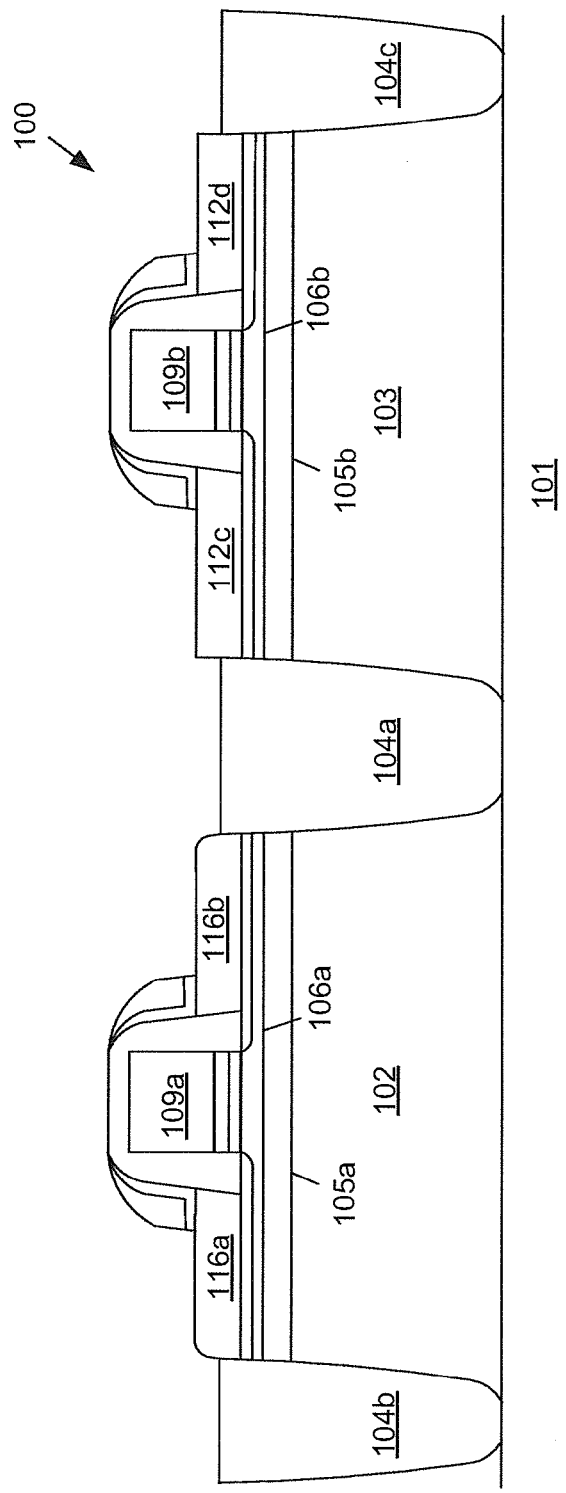
Figure 2:
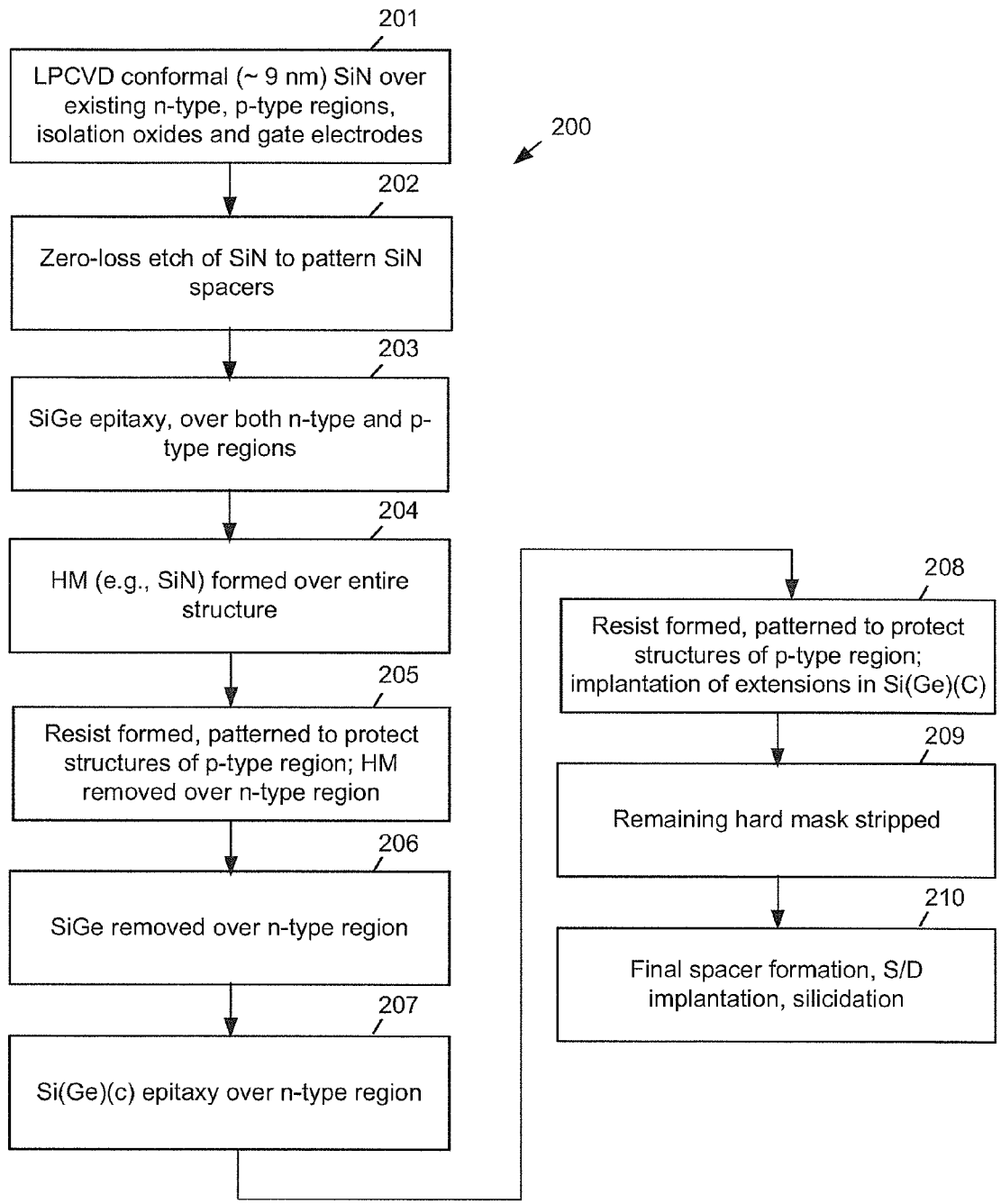
FIG. 2 is a high level flow chart illustrating a process of dual epitaxy CMOS integration for planar substrates in accordance with one embodiment of the present disclosure.

FIGS. 1A through 2, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Integration with the PMOS-first scheme that means silicon germanium (SiGe) is first grown everywhere and a protective hard mask (HM) is used, followed by a lithography step. Then a simple HM reactive ion etch (RIE) is performed with a dry etch to remove the hard mask from over the epitaxial SiGe on the NMOS structure(s), but leaving the protective layer on the PMOS structures. The SiGe epitaxy on the NMOS structures is selectively removed using the etch properties of hydrogen chloride (HCl) gas to selectively remove SiGe as opposed to structure of only silicon (Si). Optionally the epitaxial HM layer on the NMOS structures is first amorphized with an implant and then selectively removed, as HCl gas can also remove amorphous SiGe:C layers selectively versus the corresponding monocrystalline phase of such layers.

FIGS. 1A through 1J are sectional views of a portion of a semiconductor integrated circuit structure during a process of dual epitaxy CMOS integration for planar substrates in accordance with one embodiment of the present disclosure. FIG. 2 is a high level flow chart illustrating a process of dual epitaxy CMOS integration for planar substrates in accordance with one embodiment of the present disclosure, and is discussed below in conjunction with FIGS. 1A through 1J. While only a single NMOS and PMOS transistor pair are illustrated, those skilled in the art will understand that the same structures are concurrently formed using the same process for many different CMOS transistor pairs on an integrated circuit die, and on many different die within a wafer.

Those skilled in the art will recognize that the structures of FIGS. 1A through 1J, while generally drawn to illustrate approximate relative sizes or dimensions, are not drawn to scale. Those skilled in the art will further recognize that the full process for forming an integrated circuit and the associated structures are not illustrated in the drawings or described herein. Instead, for simplicity and clarity, only so much of a process for forming an integrated circuit and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

Referring first to FIG. 1A, as a starting point for dual epitaxy CMOS integration in accordance with the present disclosure, an integrated circuit structure 100 includes an optional substrate 100 on which are formed regions 102-103 of semiconductor material (e.g., silicon) each doped with a different type of impurity to produce an n-type region 102 and a p-type region 103. The n-type region 102 and p-type region 103 are electrically isolated from each other by an isolation region 104a and from adjacent integrated circuit structures on the substrate 101 by isolation regions 104b and 104c, each of which may be formed of (for example) silicon dioxide. Layers 105a and 105b and layers 106a and 106b, which may be silicon dioxide and silicon, respectively, are formed over the n-type region 102 and p-type region 103. Layers 106a and 106b may be either doped or undoped, and/or doped regions may be formed in layer 106b (or in both layers 106a and 106b). Gate electrodes for transistors are formed on the Si(Ge)(C) layers 106a and 106b, and in the exemplary embodiment each include a hafnium silicon oxide nitride (HfSiON) gate insulator 107a and 107b, a titanium nitride (TiN) barrier layer 108a and 108b, and polysilicon gate electrode 109a and 109b.

The dual epitaxy CMOS integration process 200 according to the present disclosure begins with low pressure chemical vapor deposition (LPCVD) formation of a conformal silicon nitride (SiN) layer 110 (step 201) to a thickness of approximately 9 nanometers (nm) over all of the exposed structures (i.e., both gate electrodes and the adjacent exposed portions of Si(Ge)(C), as well as isolation regions 104a through 104b). As illustrated in FIG. 1B, zero-loss etching is performed (step 202) to etch and pattern the silicon nitride layer 110, forming SiN spacers 111. In the exemplary embodiment, the etching and patterning of SiN layer 110 is performed using first a solution of hydrofluoric acid diluted with ethylene glycol (HFEG), then reactive ion etching to directionally remove portions of the SiN layer 110 while leaving substantial thicknesses of SiN on sidewalls of the gate electrodes, and finally etching with hydrofluoric (HF) acid to remove any remaining SiN over the layers 106a and 106b, leaving the SiN spacers 111 adjacent both sides of the gate electrodes.

As illustrated in FIG. 1C, epitaxy is then performed (step 203) to grow SiGe regions 112a, 112b, 112c and 112d on the exposed surfaces of the layers 106a and 106b, between the SiN spacers 111 and the isolation regions 104a, 104b and 104c. The SiGe regions 112a, 112b, 112c and 112d may be formed with impurity types and concentrations suitable for the device to be formed over the p-type region 103. As illustrated in FIG. 1D, a hard mask (HM) 113 is then formed (step 204) over the entire structure 100. Any hard mask material, such as silicon nitride, may be utilized. As shown in FIG. 1E, a photoresist 114 is formed over the hard mask 113 and patterned, to allow selective removal by RIE of the hard mark 113 over the n-type region 102 (step 205), except for portions or remnants 115 adjacent the gate electrode. Over etch with a SiN RIE relative to the SiGe layers 112a and 112b is possible due to the selectivity of the SiN RIE process. The hard mask remnants 115 over the n-type region remain due to the directional nature of the SiN RIE but are not necessary to the process flow and do not serve the functions of additional sidewall spacers in other processes. Instead, a selective etch allows the SiGe regions 112a and 112b adjacent the gate electrode over the n-type region 102 to be removed, even under the hard mask remnants 115. Epitaxial growth then allows formation of Si(Ge)(C) regions in place of the SiGe regions 112a and 112b. No additional spacers adjacent the gate electrode are necessary for removal of the SiGe regions 112a and 112b and epitaxial growth of Si(Ge)(C) in place thereof.

Referring to FIG. 1F, the resist 113 is then stripped, a preclean is performed and the SiGe over the n-type region 102 is removed by HCl etch (step 206). As shown in FIG. 1G, epitaxy is then performed (step 207) to grow Si(Ge)(C) regions 116 on exposed surfaces of layer 106a. The Si(Ge)(C) regions 116 are formed in place of the previously-removed SiGe regions 112a and 112b, including under the hard mask remnants 115. A resist 117 is formed and patterned over p-type region 103 to allow implantation of borophosphate (BP) extensions within layer 106a (step 208), as illustrated in FIG. 1H. As depicted in FIG. 1I, the resist is stripped, and the hard mask over the p-type region 103 and the remaining portions of the hard mask over the n-type region 102 are removed (step 209). Final spacer formation, source/drain (S/D) implantation, and silicidation are then performed (step 210), as depicted in FIG. 1J.

The present disclosure avoids the need to form and pattern separate spacers adjacent the gate electrode for either the NMOS or PMOS transistors in order to form Si(Ge)(C) regions. Based on the selectively of etchants for SiGe versus the (SiN) hard mask, SiGe regions may be removed from under hard mask remnants adjacent the gate. Si(Ge)(C) regions may then be epitaxially grown under those hard mask remnants. Integration of Si(Ge)(C) formation in an integrated circuit fabrication process flow is thus simplified, with less detrimental impact on device performance and defect rates.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An integrated circuit structure, comprising:
   gate electrodes over both n-type and p-type regions on a substrate; and
   silicon germanium carbon (Si(Ge)(C)) regions adjacent the gate electrode over the n-type region in at least defined spaces left by removal of silicon germanium regions.

2. The integrated circuit structure according to claim 1, wherein the silicon germanium carbon regions abut sidewall spacers on the gate electrode over the n-type region.

3. The integrated circuit structure according to claim 2, further comprising:
   remnants of a patterned hard mask on the sidewall spacers and over the silicon germanium carbon regions.

4. The integrated circuit structure according to claim 3, wherein the hard mask remnants are formed of silicon nitride.

5. The integrated circuit structure according to claim 4, wherein the silicon germanium carbon regions are epitaxially grown.

6. An integrated circuit structure, comprising:
   gate electrodes over both n-type and p-type regions on a substrate;
   silicon germanium (SiGe) regions adjacent the gate electrode over the p-type region;
   a patterned hard mask over structures on the p-type region;
   remnants of a material for the hard mask on sidewall spacers on the gate electrode over the n-type region; and
   regions containing at least silicon and germanium adjacent the gate electrode over the n-type region and under the hard mask remnants.

7. The integrated circuit structure according to claim 6, wherein the regions containing at least silicon and germanium adjacent the gate electrode over the n-type region and under the hard mask remnants are silicon germanium regions formed concurrently with the silicon germanium regions adjacent the gate electrode over the p-type region.

8. The integrated circuit structure according to claim 6, wherein the regions containing at least silicon and germanium adjacent the gate electrode over the n-type region and under the hard mask remnants are silicon germanium carbon (Si(Ge)(C)) regions epitaxially grown under the hard mask remnants.

9. The integrated circuit structure according to claim 8, wherein the hard mask is formed of silicon nitride.

10. The integrated circuit structure according to claim 9, the regions containing at least silicon and germanium adjacent the gate electrode over the n-type region and under the hard mask remnants fill an area between the sidewall spacers and isolation regions separating the n-type region from adjoining areas.

* * * * *